(12) United States Patent
Chiang

(10) Patent No.: US 8,479,387 B2
(45) Date of Patent: Jul. 9, 2013

(54) METHOD OF MANUFACTURING THREE-DIMENSIONAL CIRCUIT DEVICE

(75) Inventor: Cheng-Feng Chiang, Taoyuan Hsien (TW)

(73) Assignee: Kuang Hong Precision Co., Ltd., Taoyuan Hsien (TW)

( * ) Notice: Subject to any disclaimer, the term of this patent is extended or adjusted under 35 U.S.C. 154(b) by 279 days.

(21) Appl. No.: 12/908,217

(22) Filed: Oct. 20, 2010

(65) Prior Publication Data

US 2011/0278055 A1    Nov. 17, 2011

Related U.S. Application Data

(60) Provisional application No. 61/334,854, filed on May 14, 2010.

(51) Int. Cl.
  *H01K 3/22*    (2006.01)
(52) U.S. Cl.
  USPC ............... 29/848; 29/825; 29/846; 427/97.6
(58) Field of Classification Search
  USPC .................... 29/825, 846, 847, 848; 427/97.6
  See application file for complete search history.

(56) References Cited

U.S. PATENT DOCUMENTS

| | | | | |
|---|---|---|---|---|
| 4,532,152 A | * | 7/1985 | Elarde | 216/13 |
| 4,985,600 A | * | 1/1991 | Heerman | 174/255 |
| 4,996,391 A | * | 2/1991 | Schmidt | 174/255 |
| 5,108,553 A | * | 4/1992 | Foster et al. | 205/125 |
| 7,564,409 B2 | * | 7/2009 | Luch | 343/700 MS |

\* cited by examiner

*Primary Examiner* — Carl Arbes
(74) *Attorney, Agent, or Firm* — WPAT, P.C.; Anthony King

(57) ABSTRACT

In a method of manufacturing a three-dimensional (3D) circuit device, conducting circuits are formed on a non-conductive base through electroplating. The non-conductive base, and a circuit pattern section, at least one conducting junction and at least one current-guiding junction provided on the base are formed through double injection molding process. An electrically conductive interface layer is formed on the circuit pattern section and the junctions; and then, metal circuits are formed on the circuit pattern section through electroplating. By providing the conducting junction and the current-guiding junction, when forming metal circuits through electroplating, electroplating current can be evenly distributed over the circuit pattern section to form metal coating with uniform thickness, which enables upgraded production efficiency and reduced cost in manufacturing a 3D circuit device.

12 Claims, 18 Drawing Sheets

S11 — Form a base by injection molding a first non-conductive material

S12 — Form at least one first support, a circuit pattern section and at least one conducting junction on the base by injection molding a second non-conductive material, such that the at least one first support and the at least one conducting junction are electrically connectable to the circuit pattern section

S13 — Form an interface layer to cover the at least one first support, the circuit pattern section, and the at least one conducting junction

S14 — Form an insulating layer to cover a portion of the interface layer that is located on the at least one conducting junction

S15 — Form a metal coating to cover a portion of the interface layer that is located on the circuit pattern section

S16 — Remove portions of the interface layer and the insulating layer that are located on the at least one conducting junction

S17 — Remove the at least one first support from the base to obtain a 3D circuit device

FIG. 1

METHOD OF MANUFACTURING THREE-DIMENSIONAL CIRCUIT DEVICE

FIELD OF THE INVENTION

The present invention relates to a three-dimensional (3D) circuit device and method of manufacturing the same; and more particularly to a method of manufacturing a 3D circuit device, in which conducting circuits are formed on a non-conductive base through electroplating.

BACKGROUND OF THE INVENTION

In view of the consumers' preference to 3C products with higher usability and portability, miniaturized electronic products with light weight and multiple functions have become the main trends in the market, which in turn motivates the development of three-dimensional (3D) integrated circuit (IC) and other circuit designs. With a 3D circuit device, complicated circuits can be formed on a circuit device having very limited volume, so that electronic products using same can have reduced volume without adversely affecting their functions. In other words, with a 3D circuit device, even a miniaturized electronic product can still be provided with complicated circuits. Therefore, 3D circuit devices indeed create the potential of producing miniaturized, light weight, compact and multifunctional electronic products, and are now widely applied to various products, such as mobile phones, automobile circuits, automated teller machine, and hearing aids.

Currently, there are different methods available for manufacturing a 3D circuit device. One of these methods is referred to as Molded Interconnect Device (MID)-Double Injection Molding process, in which a non-conductive material is first injection molded into a device carrier, and then, another type of material is injection molded to form a circuit pattern on the device carrier, and finally, metal conducting circuits are grown on the circuit pattern through chemical plating. Another method for manufacturing a 3D circuit device is referred to as the MID-LDS (Molded Interconnect Device-Laser Direct Structuring) process, in which a non-conductive plastic material containing catalyst is first injection molded into a device carrier, and then, the device carrier is exposed to laser light to activate the catalyst, so that the catalyst is converted into a catalyzed nuclear for reacting with ions of a pre-plating metal in a chemical plating reaction to form metal conducting circuits.

While the above-described conventional methods for forming 3D circuit device can be used to efficiently manufacture 3D circuit devices, the circuit pattern thereof often includes of a plurality of non-interconnected circuits and the metal coating for forming the metal conducting circuits of the 3D circuit device must be highly uniform in its thickness. In the chemical plating process, no electric power is applied; and the metal catalyst attached to some areas of the circuit device that are to be formed with the circuit pattern is used to react with ions of a pre-plating metal existing in the chemical plating solution in a catalytic reaction, so that the ions of the pre-plating metal are reduced on the areas of the circuit device for forming the circuit pattern. Compared to an electroplating process, the chemical plating process has the advantages of being free from the problem of unevenly distributed electric lines of force as well as being able to form metal coating with uniform thickness even if the circuit device to be plated has a very complicated geometrical shape. That is why the conducting circuits on the 3D circuit device are generally manufactured through chemical plating.

As having been mentioned above, in the chemical plating process, no electric power is applied; and the metal catalyst attached to some surfaces of the circuit device that are to be formed with the circuit pattern is used to react with ions of a pre-plating metal existing in the chemical plating solution in a catalytic reaction, so that the ions of the pre-plating metal are reduced on the areas of the circuit device for forming the circuit pattern. Therefore, it is able to form a metal coating of uniform thickness on the surfaces of the circuit device that are to be formed with the circuit pattern. However, since the chemical plating is a chemical reduction reaction occurred without externally applied energy, it requires longer reaction time and has relatively slow deposition speed, and will produce a large quantity of plating waste. For example, in the case of chemical plating, a reaction time longer than 3 or 4 hours is required to form a copper coating of about 10 μm in thickness or a nickel coating of about 3 μm in thickness. Further, the chemical plating requires a large quantity of plating solution and reductive agent, which will increase the manufacturing cost of the 3D circuit device.

On the other hand, a copper coating or a nickel coating of the same thickness can be formed at effectively reduced reaction time through electroplating to enable increased production efficiency. Meanwhile, in the electroplating process, much less amount of plating solution is used compared to the chemical plating; and the large quantity of reductive agent can also be omitted to lower the manufacturing cost. In addition, the plating solution used in the chemical plating has relatively poor stability compared to that used in the electroplating, and therefore requires troublesome procedures to maintain, condition and recycle the plating solution, which inevitably increases the material cost in the chemical plating. In view of the problems of slow reaction time and high material cost as found in the chemical plating process, it is desirable to effectively apply the electroplating process in the manufacturing of a 3D circuit device, so as to form various three-dimensional circuit patterns and form metal coating with uniform thickness to achieve the objectives of upgraded production efficiency, reduced manufacturing cost and reduced plating waste. In this way, it is possible to substitute the electroplating for the chemical plating in manufacturing the 3D circuit device.

SUMMARY OF THE INVENTION

A primary object of the present invention is to provide a 3D circuit device and a method of manufacturing the same, so that metal conducting circuits having uniform thickness can be formed on a 3D circuit device through electroplating.

To achieve the above and other objects, the method of manufacturing 3D circuit device according to the present invention includes the steps of forming a base by injection molding a first non-conductive material; forming at least one first support, a circuit pattern section, and at least one conducting junction on the base by injection molding a second non-conductive material, such that the at least one first support and the at least one conducting junction are electrically connectable to the circuit pattern section; forming an interface layer on the at least one first support, the at least one conducting junction, and the circuit pattern section; forming an insulating layer on a portion of the interface layer that is located on the at least one conducting junction; forming a metal coating on a portion of the interface layer that is located on the circuit pattern section; removing portions of the interface layer and the insulating layer that are located on the at least one conducting junction; and removing the at least one first support from the base to obtain a 3D circuit device.

In an embodiment of the present invention, in the step of forming the base by injection molding the first non-conductive material, at least one second support is further formed at the same time to connect to the base.

In the above method, the metal coating is formed on the circuit pattern section through electroplating, and the circuit pattern section includes at least one circuit.

In an embodiment of the present invention, in the step of forming the at least one first support, the circuit pattern section, and the at least one conducting junction on the base by injection molding a second non-conductive material, at least one current-guiding junction is further formed on the base at the same time, such that the at least one current-guiding junction, the at least one first support, and the at least one conducting junction are electrically connectable to the circuit pattern section.

Preferably, the at least one current-guiding junction is provided among the circuits in the circuit pattern section for guiding electroplating current to uniformly distribute over the circuits during the process of electroplating.

The at least one conducting junction is used to connect the at least one first support to the circuit pattern section, so as to serve as a current conducting point for the circuit pattern section in the process of electroplating.

To achieve the above and other objects, the 3D circuit device according to the present invention includes a base formed of a first non-conductive material; a circuit pattern section formed on the base according to a pattern and including at least one circuit; and at least one conducting junction provided on the base for connecting an edge of the base to the circuit pattern section. In the present invention, the circuit pattern section and the at least one conducting junction are formed of a second non-conductive material.

The at least one conducting junction is used to connect the circuit pattern section to an edge of the base and at least one first support.

In an embodiment of the present invention, the 3D circuit device further includes a current-guiding junction, which is provided on the base to locate among and electrically connect to the circuits in the circuit pattern section.

With the above arrangements, the 3D circuit device and the manufacturing method thereof according to the present invention have one or more of the following advantages:

(1) By forming the metal circuits through electroplating, it is not necessary to use a large quantity of chemical plating solution. Meanwhile, with the electroplating process, the metal coating can be deposited faster compared to the chemical plating. Therefore, the 3D circuit device of the present invention can be produced at reduced manufacturing cost and upgraded production efficiency while the plating waste can be reduced to minimize any possible environmental pollution.

(2) The conducting junctions and the current-guiding junctions are evenly distributed among the circuits based on the lengths of conducting paths among different circuits, the area or the geometrical shape of the circuit pattern section and the like, so that electroplating current can be uniformly distributed over different areas of the circuit pattern section to produce a metal circuit layer with uniform thickness.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 is a flowchart showing the steps included in a method of manufacturing a 3D circuit device according to the present invention;

DETAILED DESCRIPTION OF THE PREFERRED EMBODIMENTS

Figure 2:
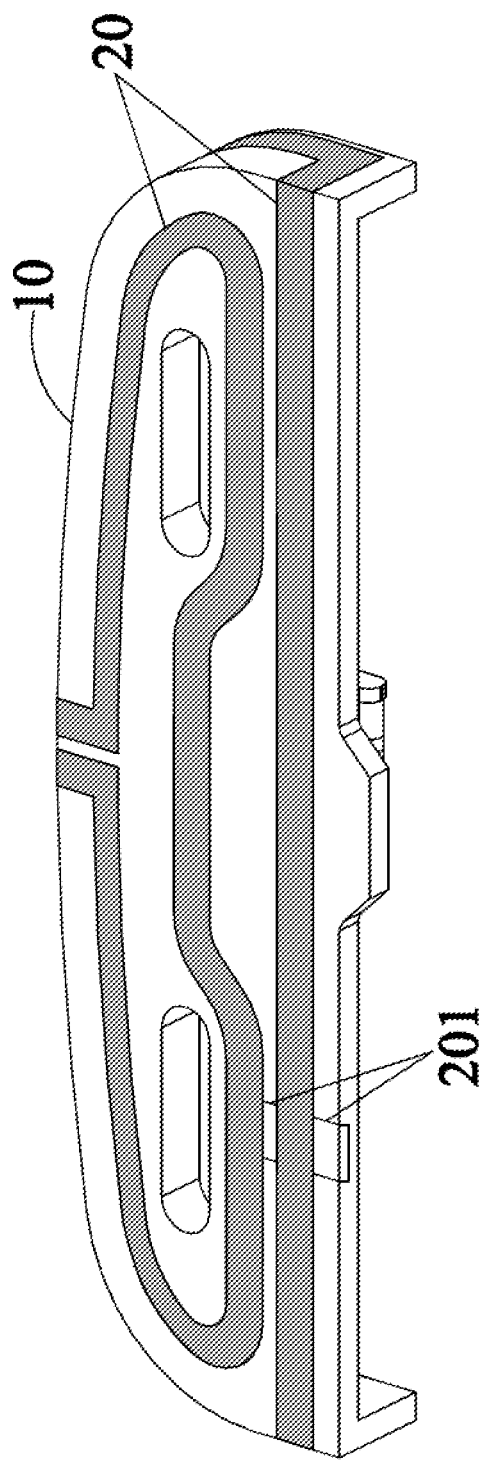
FIG. 2 is a schematic view of a 3D circuit device according to a first embodiment of the present invention manufactured using the method of FIG. 1.

The present invention will now be described with some preferred embodiments thereof and with reference to the accompanying drawings. For the purpose of easy to understand, elements that are the same in the preferred embodiments are denoted by the same reference numerals.

The present invention provides a three-dimensional (3D) circuit device and method of manufacturing same. Please refer to FIG. 1 that is a flowchart showing the steps included in the method of manufacturing a 3D circuit device according to the present invention, and to FIG. 2 that schematically shows a 3D circuit device according to a first embodiment of the present invention manufactured using the method of FIG. 1.

As shown in FIG. 1, the method of manufacturing a 3D circuit device according to the present invention includes the following steps: (S11) forming a base by injection molding a first non-conductive material; (S12) forming at least one first support, a circuit pattern section, and at least one conducting junction on the base by injection molding a second non-conductive material, such that the at least one first support and the at least one conducting junction are electrically connectable to the circuit pattern section; (S13) forming an interface layer to cover the at least one first support, the circuit pattern section, and the at least one conducting junction; (S14) forming an insulating layer to cover a portion of the interface layer that is located on the at least one conducting junction; (S15) forming a metal coating to cover a portion of the interface layer that is located on the circuit pattern section; (S16) removing the portions of the interface layer and the insulating layer that are located on the at least one conducting junction; and (S17) removing the at least one first support from the base to obtain a 3D circuit device.

In the above-described method, the first non-conductive material can be any non-conductive plastic material; and the second non-conductive material is a non-conductive plastic material suitable for using in a chemical plating process.

In the step S15, the metal coating is formed on the circuit pattern section by electroplating, and the circuit pattern section includes at least one circuit.

In the method of the present invention, the at least one conducting junction connects the at least one first support to the circuit pattern section, so as to serve as a current conducting point for the circuit pattern section in the process of electroplating.

In the step S12, there can be further included a step of forming at least one current-guiding junction for connecting to the at least one circuit, so as to uniformly guide electroplating current to the at least one circuit in the process of electroplating.

As can be seen from FIG. 2, the 3D circuit device manufactured using the method of the present invention shown in FIG. 1 includes a base 10; a circuit pattern section 20 provided on the base 10 according to a pattern; a metal coating covered on the circuit pattern section 20 and indicated by the gray area in FIG. 2; and at least one conducting junction 201 provided on the base 10 for connecting an edge of the base 10 to the circuit pattern section 20.

Figure 3:
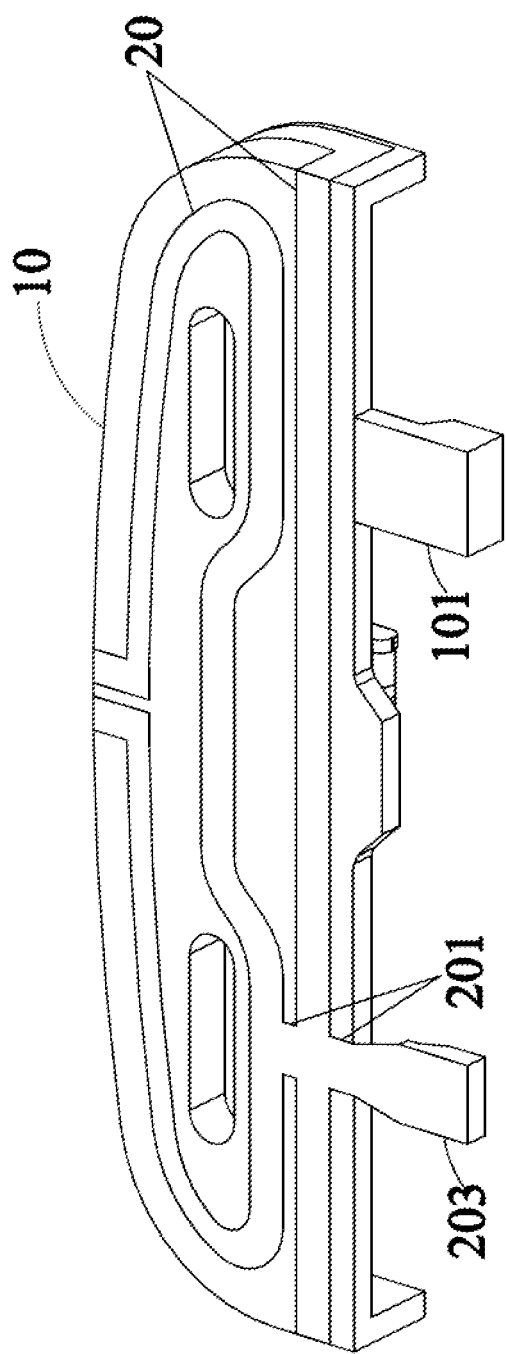
FIG. 3 is a schematic view showing the 3D circuit device according to a first form of the first embodiment after completion of the steps S11 and S12 shown in FIG. 1.

Please refer to FIG. 3 that schematically shows the 3D circuit device according to a first form of the first embodiment after completion of the steps S11 and S12. As shown, the 3D circuit device at this stage includes the base 10 formed by injection molding the first non-conductive material in the step S11, and at least one first support 203, the at least one conducting junction 201, and the circuit pattern section 20 formed on the base 10 by injection molding the second non-conductive material in the step S12.

Figure 4:
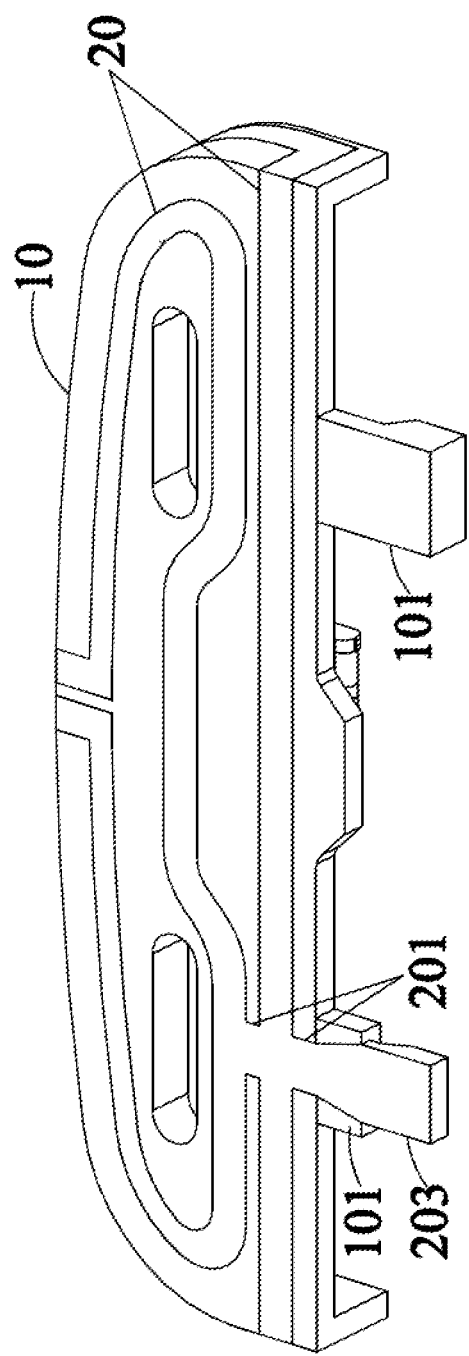
FIG. 4 is a schematic view showing the 3D circuit device according to a second form of the first embodiment after completion of the steps S11 and S12 shown in FIG. 1.

According to the 3D circuit device manufacturing method of the present invention, in the step S11 of forming the base 10 by injection molding the first non-conductive material, it is also possible to further form at least one second support 101 connected to the base 10. FIG. 4 schematically shows the 3D circuit device according to a second form of the first embodiment after completion of the steps S11 and S12. The second form is different from the first form in having at least one second support 101 formed on the base 10 in the step S11. The at least one second support 101 and the at least one first support 203 will be removed from the base 10 later in the step S17.

Figure 5:
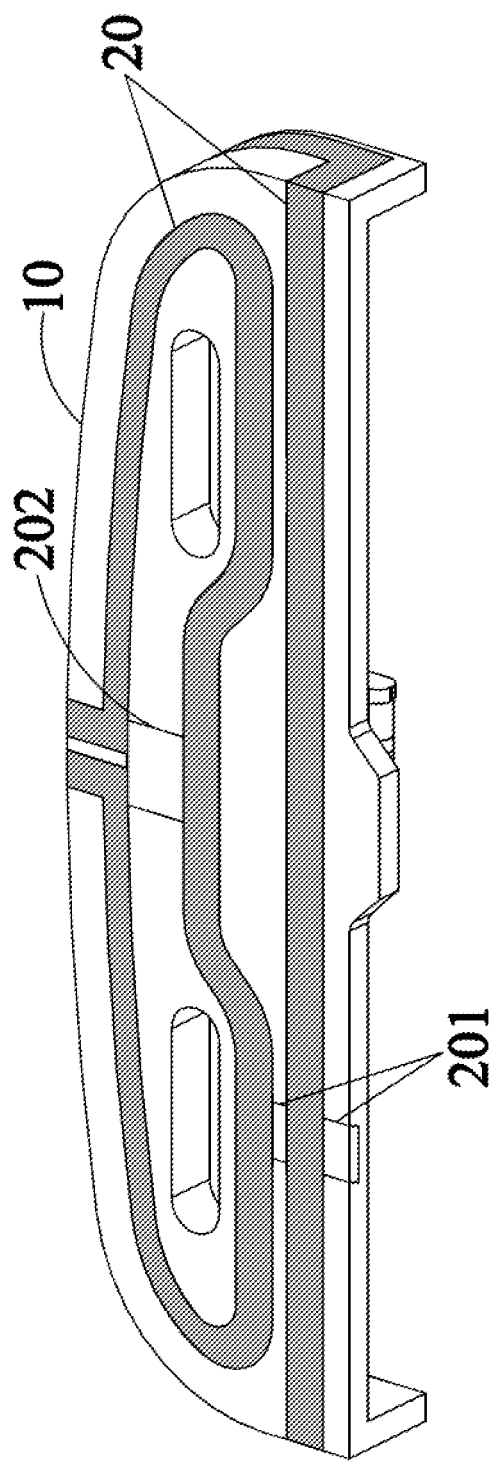
FIG. 5 is a schematic view of a 3D circuit device according to a second embodiment of the present invention manufactured using the method of FIG. 1.

In addition, in the step S12 of forming the at least one first support 203, the circuit pattern section 20, and the at least one conducting junction 201 on the base 10 by injection molding the second non-conductive material, it is also possible to further form at least one current-guiding junction 202 on the base 10, so that a 3D circuit device according to a second embodiment of the present invention as shown in FIG. 5 can be obtained. As shown in FIG. 5, the 3D circuit device according to the second embodiment includes a base 10, a circuit pattern section 20, a metal coating covered on the circuit pattern section 20 and indicated by the gray area in FIG. 5, at least one conducting junction 201 provided on the base 10 to connect an edge of the base 10 to the circuit pattern section 20, and at least one current-guiding junction 202 provided on the base 10 to connect an edge of the base 10 to the circuit pattern section 20.

The at least one current-guiding junction 202 is provided on the base 10 for connecting to the circuit pattern section 20. In the case there is at least one current-guiding junction 202 formed in the step S12, the interface layer formed in the step S13 for covering the at least one conducting junction 201 will also be formed to cover the at least one current-guiding junction 202; and the insulating layer formed in the step S14 for covering the at least one conducting junction 201 will also be formed to cover the at least one current-guiding junction 202. The portions of the interface layer and the insulating layer covering the at least one current-guiding junction 202 will also be removed in the step S16.

Moreover, in the second embodiment, when the first non-conductive material is injection molded in the step S11 to form the base 10, it is also possible to simultaneously form the at least one second support 101 shown in FIG. 4.

To enable easy description of the 3D circuit device and the manufacturing method thereof according to the present invention, the following description is based on the second embodiment of the 3D circuit device having at least one current-guiding junction, and based on different forms of the second embodiment with and without forming the at least one second support 101 in the step S11. In the following description, other embodiments of the present invention having at least one current-guiding junction will also be compared with one another to find the differences between them; and, designing differences in the at least one first and the at least one second support between different embodiments will also be described.

Please refer to FIGS. 6 to 11 that sequentially show the 3D circuit device according to the first form of the second embodiment after completion of each of the steps S11 to S17. The 3D circuit device according to the first form of the second embodiment has at least one second support 101 formed in the step S11.

Figure 6:
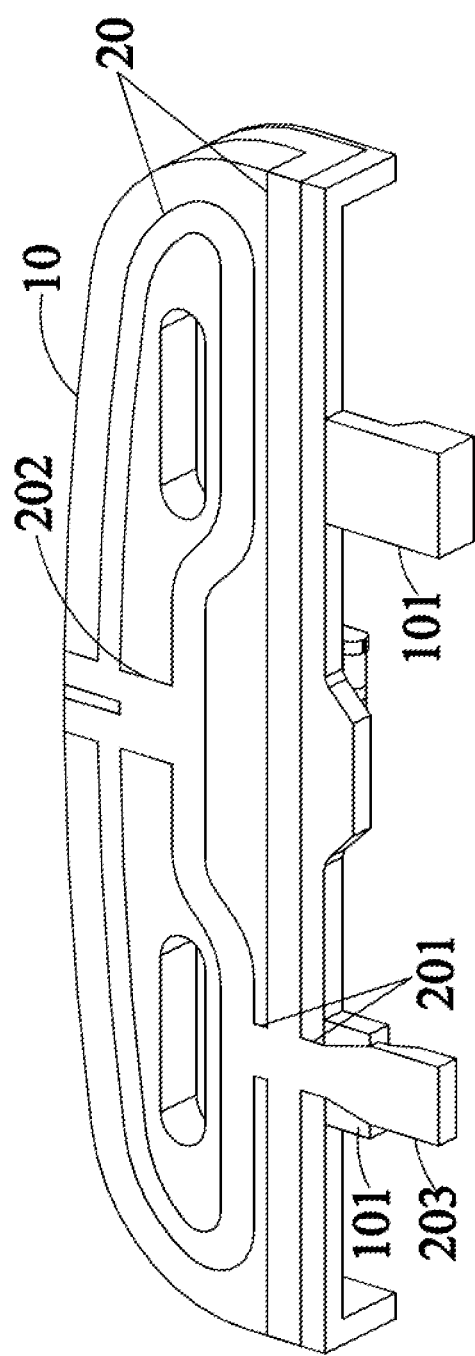
FIG. 6 is a schematic view showing the 3D circuit device according to a first form of the second embodiment after completion of the steps S11 and S12 shown in FIG. 1.

First, please refer to FIG. 6 that schematically shows the 3D circuit device according to the first form of the second embodiment after completion of the steps S11 and S12. In the step S11, a base 10 is formed by injection molding a first non-conductive material; and in the step S12, a circuit pattern section 20, at least one conducting junction 201, and at least one first support 203 are formed on the base 10 by injection molding a second non-conductive material, so that the conducting junction 201 and the current-guiding junction 202 are electrically connectable to the circuit pattern section 20. Wherein, according to the first form of the second embodiment, at least one second support 101 is further formed on the base 10 in the step S11 by injection molding the first non-conductive material, and at least one current-guiding junction 202 is further formed on the base 10 in the step S12 by injection molding a second non-conductive material. The first support 203 is connected to the conducting junction 201, and further connected to the circuit pattern section 20 via the conducting junction 201. The current-guiding junction 202 is located between different circuits in the circuit pattern section 20 to shorten the conducting paths among different circuits in the process of electroplating, so as to balance the electroplating current distributed over the circuit pattern section 20. Further, in the case the circuit pattern section 20 is designed to include a plurality of non-interconnected circuits, the current-guiding junction 202 not only shortens the conducting paths among different circuits in the process of electroplating, but also interconnects the initially not connected circuits.

The first non-conductive material can be any non-conductive plastic material, and the second non-conductive material is a non-conductive plastic material suitable for use in chemical plating. Further, by calculating the lengths, geometrical shapes and areas of different conducting paths, it is able to discretionally provide a plurality of conducting junctions 201 and current-guiding junctions 202 among the circuits based on the results of calculation, so as to achieve the purpose of balancing the current in different circuits and avoid any adverse influence on the thickness of the formed metal coating due to unevenly distributed electric lines of force in the electroplating process.

Figure 7:
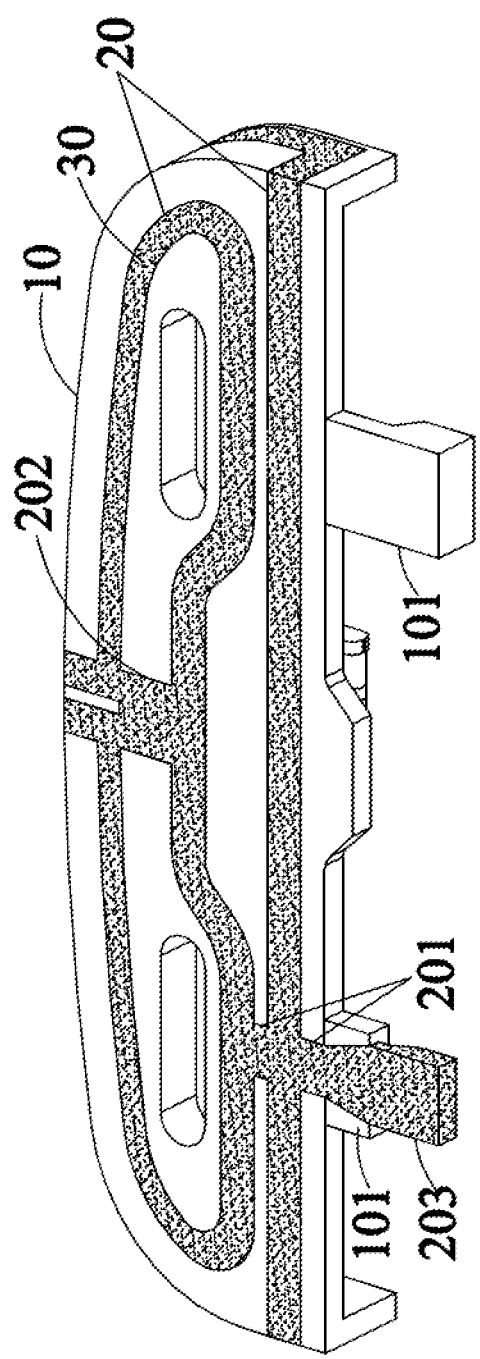
FIG. 7 is a schematic view showing the 3D circuit device according to the first form of the second embodiment after completion of the step S13 shown in FIG. 1.

FIG. 7 schematically shows the 3D circuit device according to the first form of the second embodiment after completion of the step S13. As shown, an interface layer 30 is formed in the step S13 to cover one face of the first support 203 that is connected to the circuit pattern section 20, the circuit pattern section 20, the at least one conducting junction 201, and the at least one current-guiding junction 202. The areas with the interface layer 30 formed thereon are indicated by finely dots in FIG. 7. The interface layer 30 must be electrically conductive, and can be formed in different ways. In the present invention, the interface layer 30 is formed by chemical plating and is a conductive metal layer having a thickness ranged between about 0.1 μm and about 2 μm. Most preferably, the interface layer 30 has a thickness ranged between 0.2 μm and 1 μm, and is formed of an electrically conductive metal material, such as copper or nickel. Since the second non-conductive material is a non-conductive plastic material suitable for use in chemical plating, the interface layer 30 can be formed on the areas that are formed of the second non-conductive material.

By providing the interface layer 30, the first support 203, the circuit pattern section 20, the conducting junction 201 and the current-guiding junction 202 are electrically connectable to one another. Thus, during the electroplating in the step S15, when the first support 203 is connected to the negative pole of a power supply, the circuit pattern section 20 electrically connected to the first support 203 can serve as a negative electrode in the electroplating process, and the positive pole of the power supply is connected to a desired solid metal. When the circuit device is immersed in an electroplating bath containing ions of a pre-plating metal, the ions of the pre-plating metal will receive electrons on the surface of the interface layer 30 covering the circuit pattern section 20, which serves as the negative electrode, so that the ions are reduced and the pre-plating metal is deposited on the circuit pattern section 20 to form the desired metal circuits. Wherein, the pre-plating metal can be a metal material selected from the group consisting of copper, nickel, chromium, tin, silver and gold.

Figure 8:
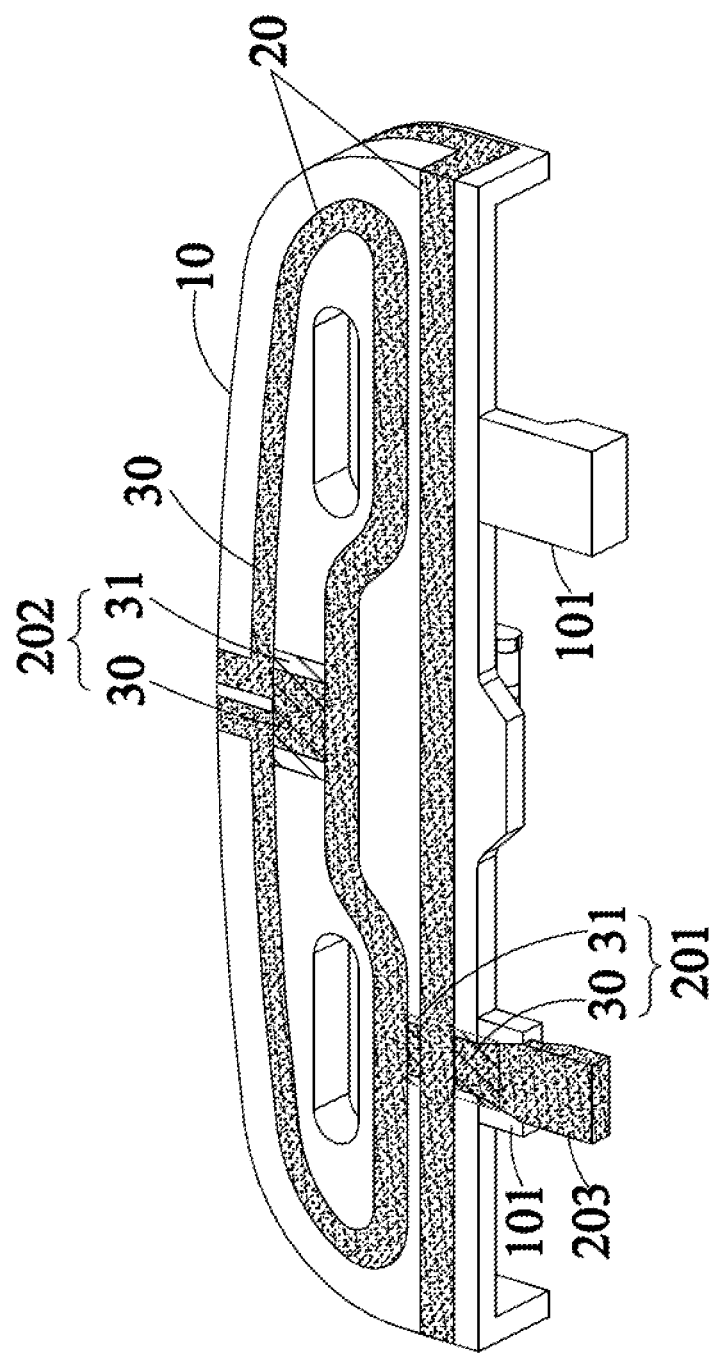
FIG. 8 is a schematic view showing the 3D circuit device according to the first form of the second embodiment after completion of the step S14 shown in FIG. 1.

Then, FIG. 8 schematically shows the 3D circuit device according to the first form of the second embodiment after completion of the step S14. As shown, an insulating layer 31 is formed in the step S14 to cover portions of the interface layer 30 that are located on the at least one conducting junction 201 and the at least one current-guiding junction 202. The areas with the insulating layer 31 formed thereon are marked by slant lines in FIG. 8. The insulating layer 31 can be formed by printing or jetting desired ink or paint on the interface layer 30 at the desired areas. The ink can be a solvent-based acid-proof ink, a water-based acid-proof ink, an acid-resistant but not alkali-proof ink, an ultraviolet (UV) curable ink, or an electroplating-resistant ink or paint. Alternatively, an insulating tape can be used to form the insulating layer 31.

By forming the insulating layer 31 in the step S14 to cover the portions of the interface layer 30 located on the conducting junction 201 and the current-guiding junction 202, the conducting junction 201 and the current-guiding junction 202 can electrically connect to the circuit pattern section 20 and the first support 203 via the interface layer 30 during the electroplating in the step S15 without any metal coating being formed on these junctions to cause any change in the circuit pattern to be formed. In other words, by providing the insulating layer 31, it is able for the conducting junction 201 and the current-guiding junction 202 to conduct electric current in the electroplating process while no metal coating would be formed thereon.

Figure 9:
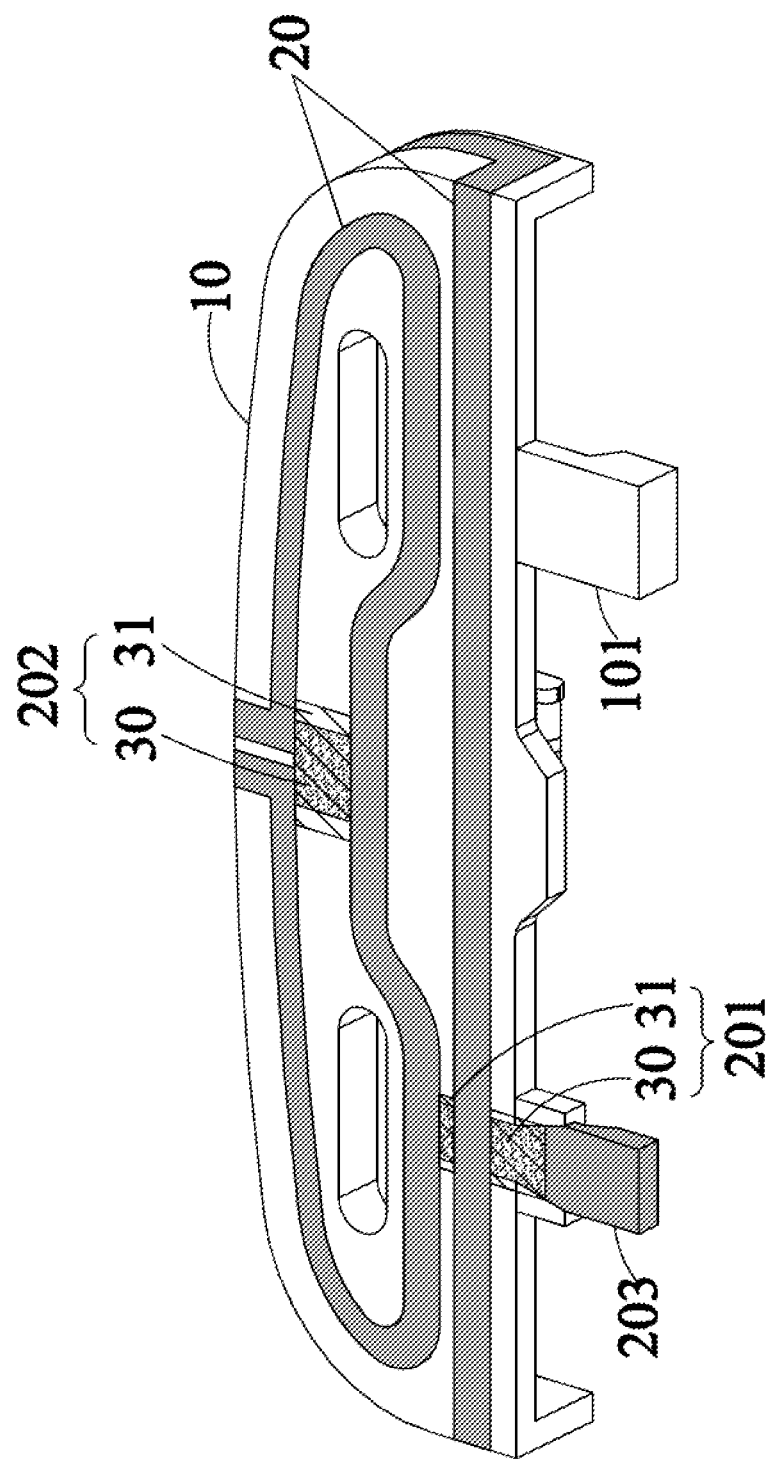
FIG. 9 is a schematic view showing the 3D circuit device according to the first form of the second embodiment after completion of the step S15 shown in FIG. 1.

FIG. 9 schematically shows the 3D circuit device according to the first form of the second embodiment after completion of the step S15. The gray areas in FIG. 9 indicate the areas being covered by the metal coating formed in the electroplating process. As can be seen in FIG. 9, there is not any metal coating formed on the conducting junction 201 and the current-guiding junction 202; and the metal coating is formed only on the circuit pattern section 20 and the first support 203.

Figure 10:
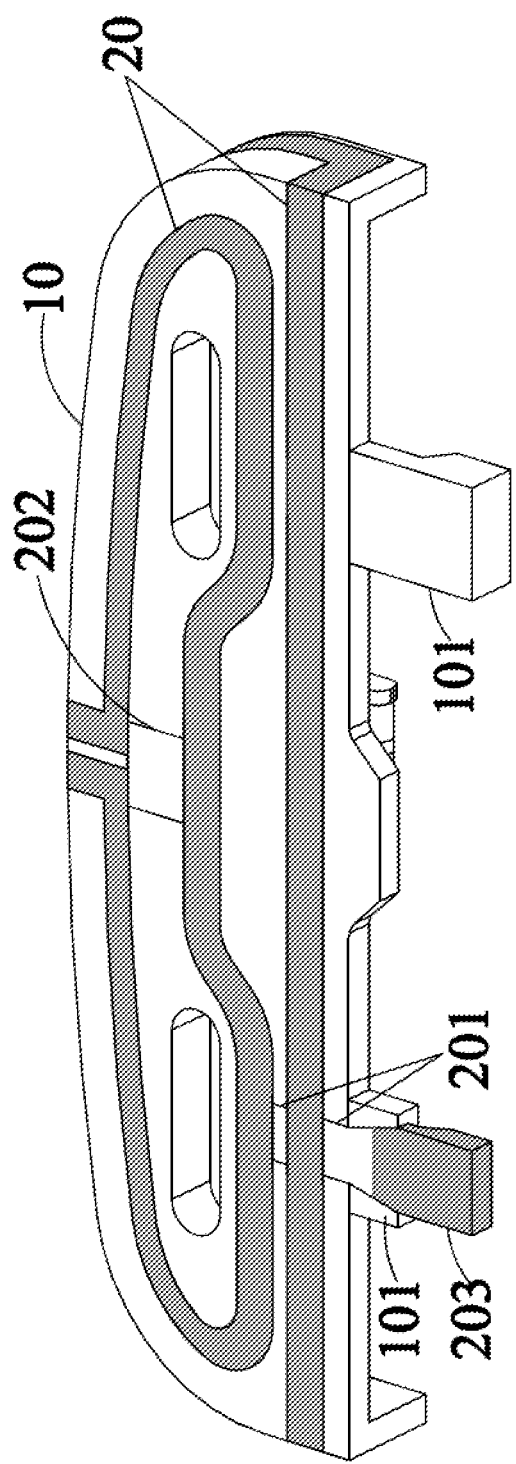
FIG. 10 is a schematic view showing the 3D circuit device according to the first form of the second embodiment after completion of the step S16 shown in FIG. 1.

FIG. 10 schematically shows the 3D circuit device according to the first form of the second embodiment after completion of the step S16. In the step S16, portions of the insulating layer 31 and the interface layer 30 on the conducting junction 201 and the current-guiding junction 202 are removed therefrom, so that the conducting junction 201 and the current-guiding junction 202 are no longer electrically connected to the circuit pattern section 20 and would not affect the circuit pattern formed by the metal coating. As can be seen in FIG. 10, after the insulating layer 31 and the interface layer 30 covered on the junctions 201, 202 are removed therefrom, the second non-conductive material forming the conducting junction 201 and the current-guiding junction 202 is exposed to open air again. In FIG. 10, the exposed surface of the second non-conductive material is indicated by white color.

Portions of the insulating layer 31 and the interface layer 30 covered on the conducting junction 201 and the current-guiding junction 202 can be removed in a dry way by using laser, for example, to remove the insulating and interface layers at the same time; or in a wet way by using an alkaline solution or a stripper and a suitable ultrasonic device or using electrolysis to remove the insulating layer first, and then using an acid solution or a micro-etching chemical to remove the interface layer. By using laser, it is able to remove only the portions of the insulating layer and the interface layer that are located at joints between the circuit pattern section 20 and the conducting and current-guiding junctions 201, 202, provided the electrically conductive interface layer 30 left on the conducting junction 201 and the current-guiding junction 202 would not cause any change in the circuit pattern section 20.

Figure 11:
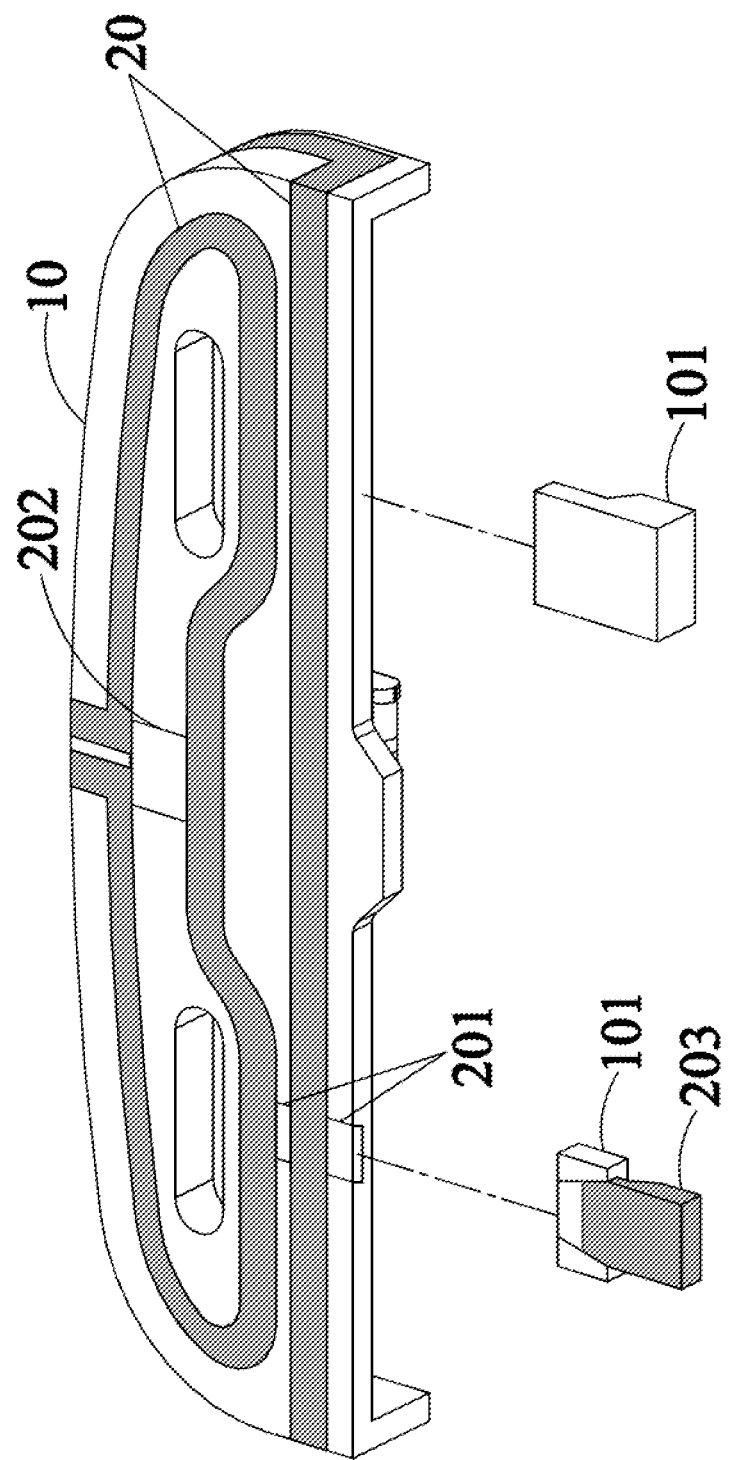
FIG. 11 is a schematic view showing the 3D circuit device according to the first form of the second embodiment after completion of the step S17 shown in FIG. 1.

Finally, FIG. 11 schematically shows the 3D circuit device according to the first form of the second embodiment after completion of the step S17. In the step S17, the first support 203 and the second support 101 are removed from the base 10 to obtain the 3D circuit device shown in FIG. 5. Wherein, the first support 203 and the second support 101 are removed from the base 10 to avoid any adverse influence on the appearance of the 3D circuit device as well as the pattern and function of the metal circuits on the 3D circuit device.

In the process of electroplating, it is necessary to ensure that no metal coating will be formed on the first support 203, which is also covered by the interface layer 30, at areas adjacent to and in contact with the circuit pattern section 20, so that the circuit pattern section 20 is not affected when the first support 203 adjacent thereto is removed from the base 10. For this purpose, different designs are available for a joint of the first support 203 and the base 10. For example, as shown in FIG. 9, in the 3D circuit device according to the first form of the second embodiment after completion of the step S15, a cut end of the first support 203 connected to the base 10, i.e. an end of the first support 203 that is to be cut for removing the first support 203 from the base 10, is not in direct contact with the circuit pattern section 20. Instead, an area of a certain length is left between the first support 203 and the circuit pattern section 20, and the conducting junction 201 is formed within this area. Since the interface layer 30 on the conducting junction 201 is covered by the insulating layer 31, no metal coating will be formed between the first support 203 and the circuit pattern section 20 during the electroplating process. Therefore, it is ensured the removal of the first support 203 from the base 10 would not affect the initial circuit design in the circuit pattern section 20. As can be seen in FIG. 9, the insulating layer 31 covered on the conducting junction 201 is slightly extended into the at least one first support 203. With this arrangement, no metal buns would be left on the joint of the at least one first support 203 and the conducting junction 201 when the at least one first support 203 is removed from the base 10.

It can also be seen in FIG. 9 that the second support 101 formed of the first non-conductive material covers around the cut end of the first support 203 connected to the base 10, such that only the face of the first support 203 connected to the conducting junction 201 is exposed to the open air. With this arrangement, no metal coating will be formed around the joint of the first support 203 and the base 10 in the process of electroplating. Thus, no metal burrs would be produced on the base 10 to affect the design of the 3D circuit device when the first support 203 is removed from the base 10. Since the second support 101 formed of the first non-conductive material would not have its surface covered by any interface layer during the chemical plating in the step S13, it can be assured that no metal coating will be formed on the second support 101 during the process of electroplating.

As mentioned above, in the manufacturing process of the 3D circuit device according to the first form of the second embodiment, the first support 203 and the base 10 are connected to each other in a manner that ensures the removal of the first support 203 from the base 10 will not adversely affect the original design of the circuit pattern section 20 on the 3D circuit device or leave any metal burrs on the base 10.

Figure 12:
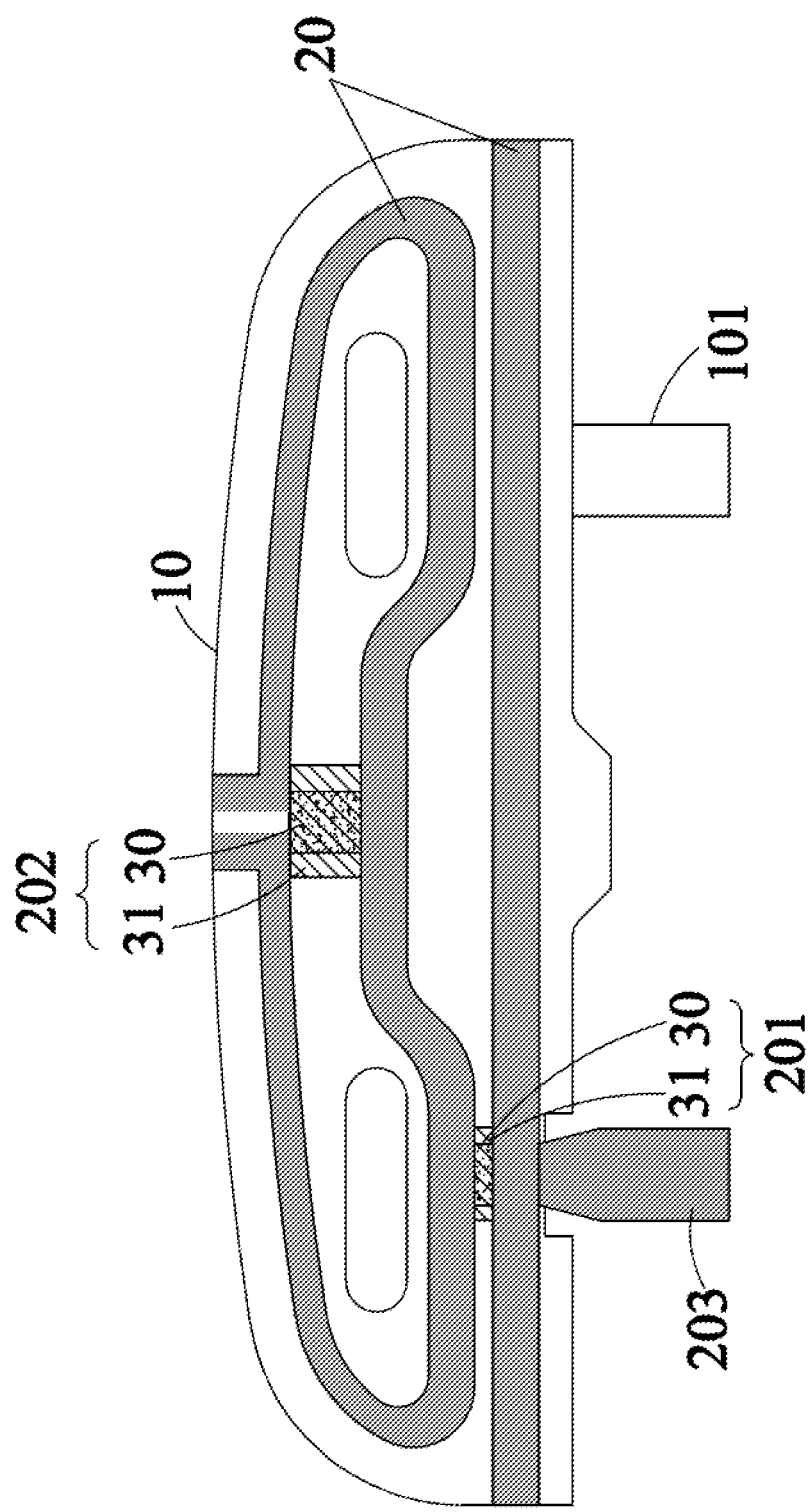
FIG. 12 is a schematic view showing a 3D circuit device according to one form of a third embodiment of the present invention after completion of the step S15 shown in FIG. 1.
Figure 13:
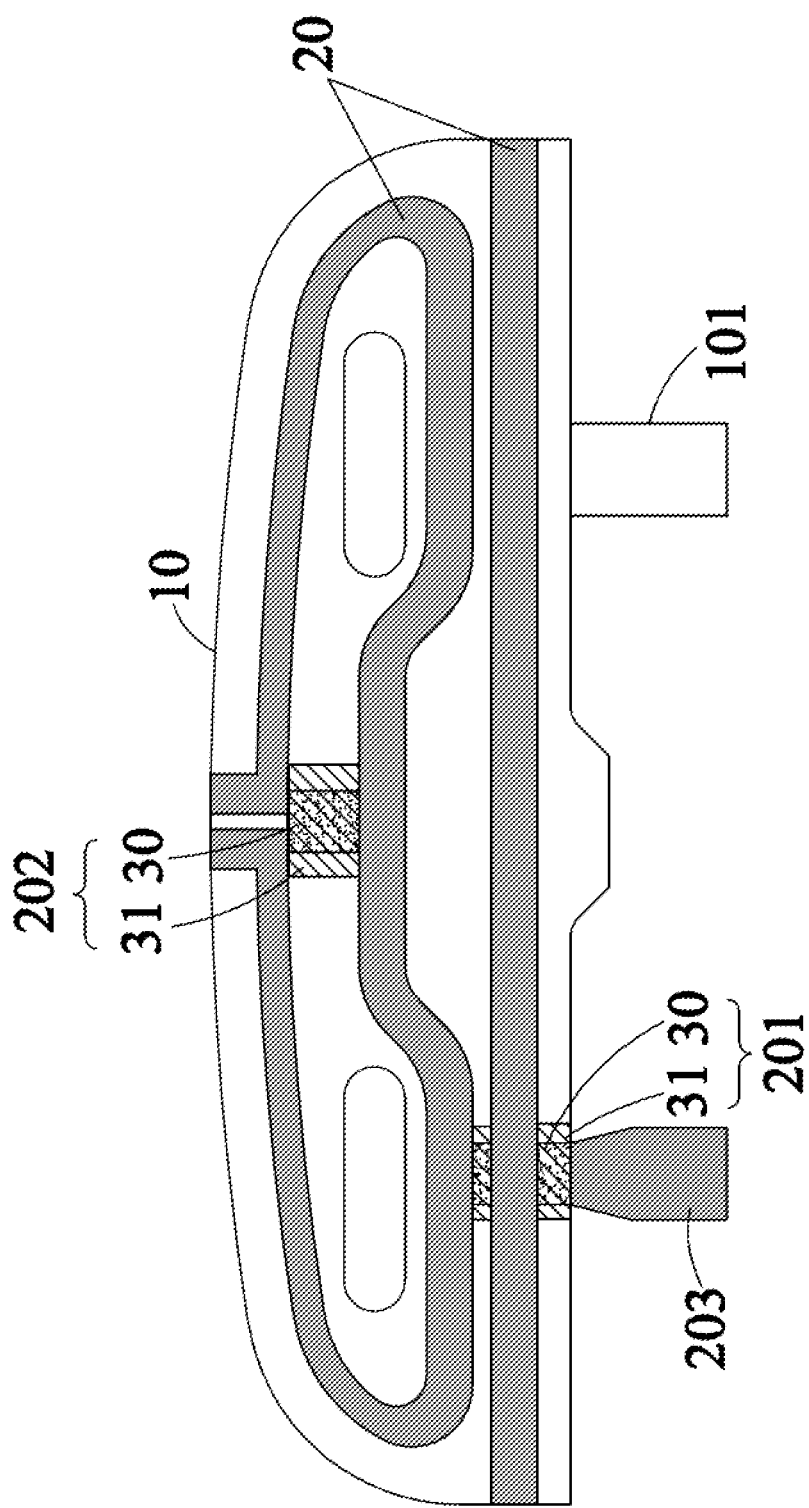
FIG. 13 is a schematic view showing the 3D circuit device according to a second form of the second embodiment after completion of the step S15 shown in FIG. 1.

FIG. 12 schematically shows the 3D circuit device according to one form of a third embodiment of the present invention after completion of the step S15; and FIG. 13 schematically shows the 3D circuit device according to a second form of the second embodiment thereof after completion of the step S15. As can be seen from FIGS. 12 and 13, the 3D circuit devices in the second and the third embodiment are identical in the design of the circuit pattern section 20, the arrangement of the conducting junction 201, and the arrangement of the current-guiding junction 202. Since the manufacturing method for the 3D circuit device according to the above embodiments is same, it is not repeatedly described herein.

A significant difference among the first form of the second embodiment after the step S15, the second form of the second embodiment after the step S15, and one form of the third embodiment after the step S15 lies in the manner of connecting the first support 203 to the base 10.

As can be seen in FIG. 12, in manufacturing the 3D circuit device according to one form of the third embodiment, the first support 203 has a cut end, at where the first support 203 is removed from the base 10, is directly connected to the circuit pattern section 20. Thus, a great care must be taken in removing the first support 203 from the base 10 to avoid any possible damage to the directly connected circuit pattern section 20. Further, the joint of the first support 203 and the base 10 is not covered around by the first non-conductive material. Therefore, metal buns tend to form on the base 10 around the joint of the base 10 and the first support 203 after the latter is removed from the base 10, and these metal burrs must be trimmed depending on actual need.

As can be seen in FIG. 13, in the 3D circuit device according to the second form of the second embodiment after completion of the step S15, the first support 203 is not directly connected to the circuit pattern section 20 and is, as in the first form of the second embodiment, connected to the circuit pattern section 20 via the conducting junction 201. However, since the joint of the first support 203 and the base 10 is not covered by the first non-conductive material, metal burrs tend to form around the joint of the first support 203 and the base 10 after the first support 203 is removed from the base 10. And, such metal buns must be trimmed depending on actual need.

Figure 14:
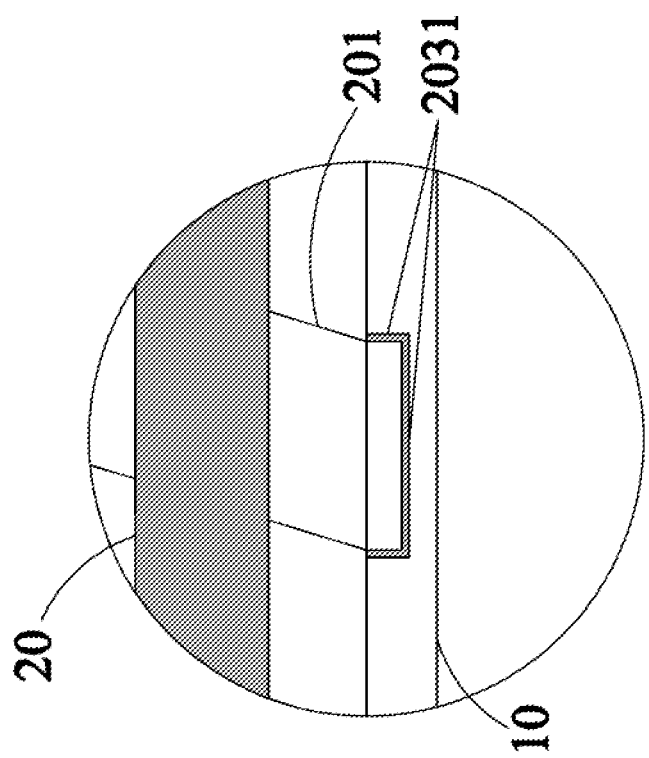
FIG. 14 is a schematic view showing that metal buns are left on the base when the first support is removed from the base of the 3D circuit device (as performed in S15) according to the second form of the second embodiment.

FIG. 14 shows that, in the 3D circuit device according to the second form of the second embodiment after completion of the step S15, metal buns 2031 are left on the base 10 after the first support 203 is removed from the base 10. As can be seen in FIG. 14, metal buns 2031 will form on the base 10 around the disconnected joint of the first support 203 and the base 10 and must be trimmed according to actual need.

Figure 15:
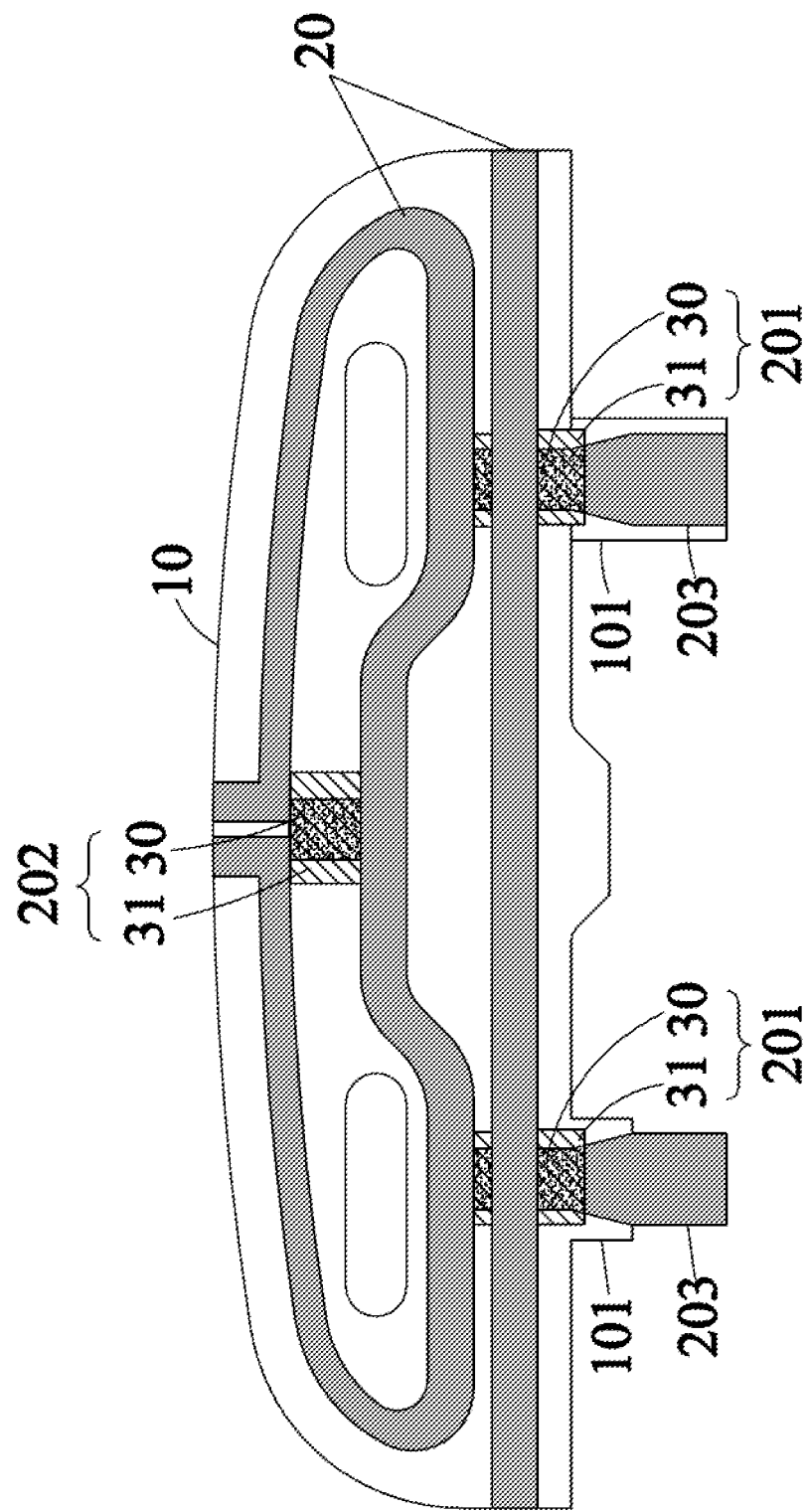
FIG. 15 is a schematic view showing the 3D circuit device according to a first form of a fourth embodiment of the present invention after completion of the step S15 shown in FIG. 1.
Figure 16:
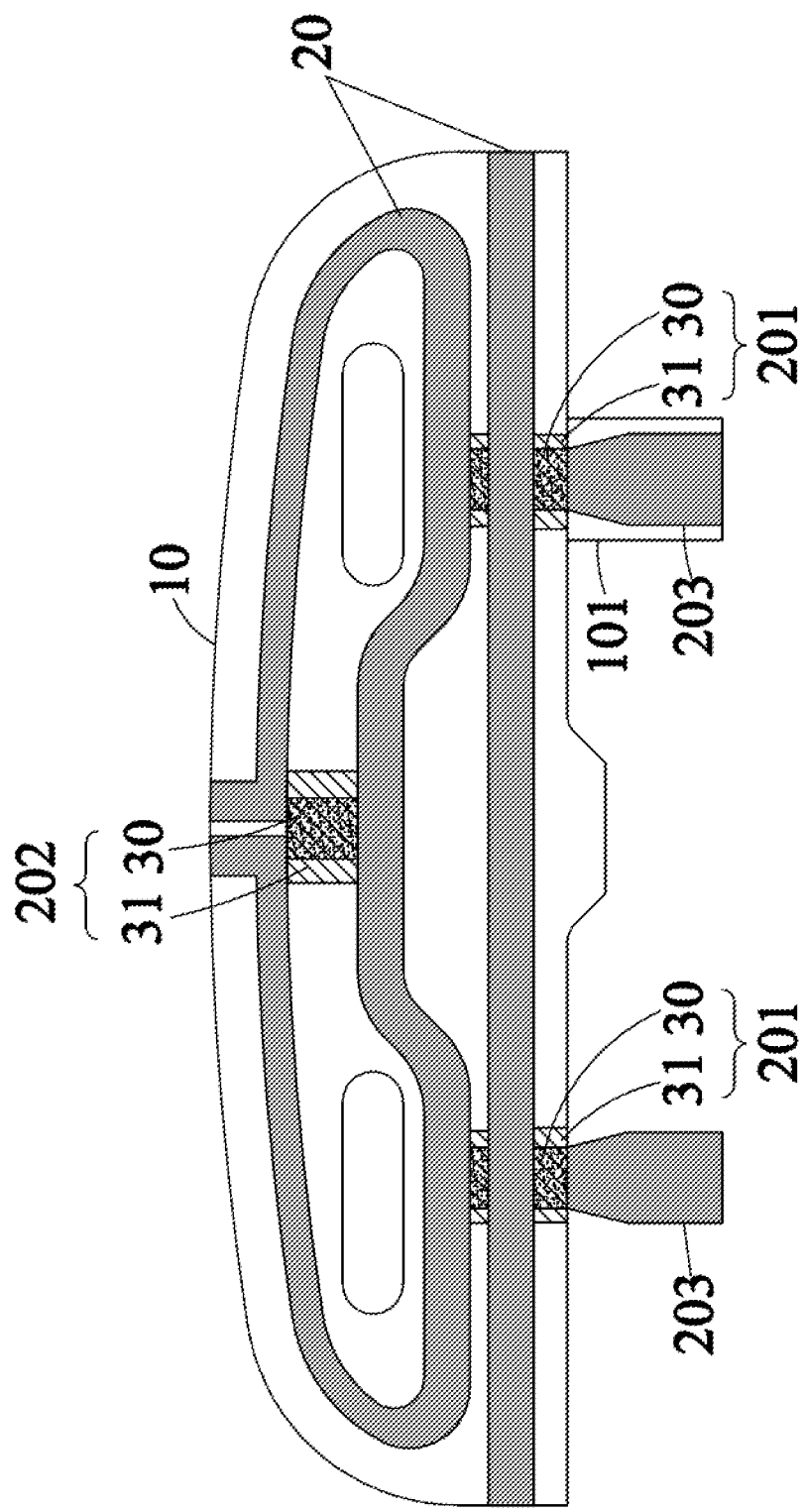
FIG. 16 is a schematic view showing the 3D circuit device according to a second form of the fourth embodiment after completion of the step S15 shown in FIG. 1.
Figure 17:
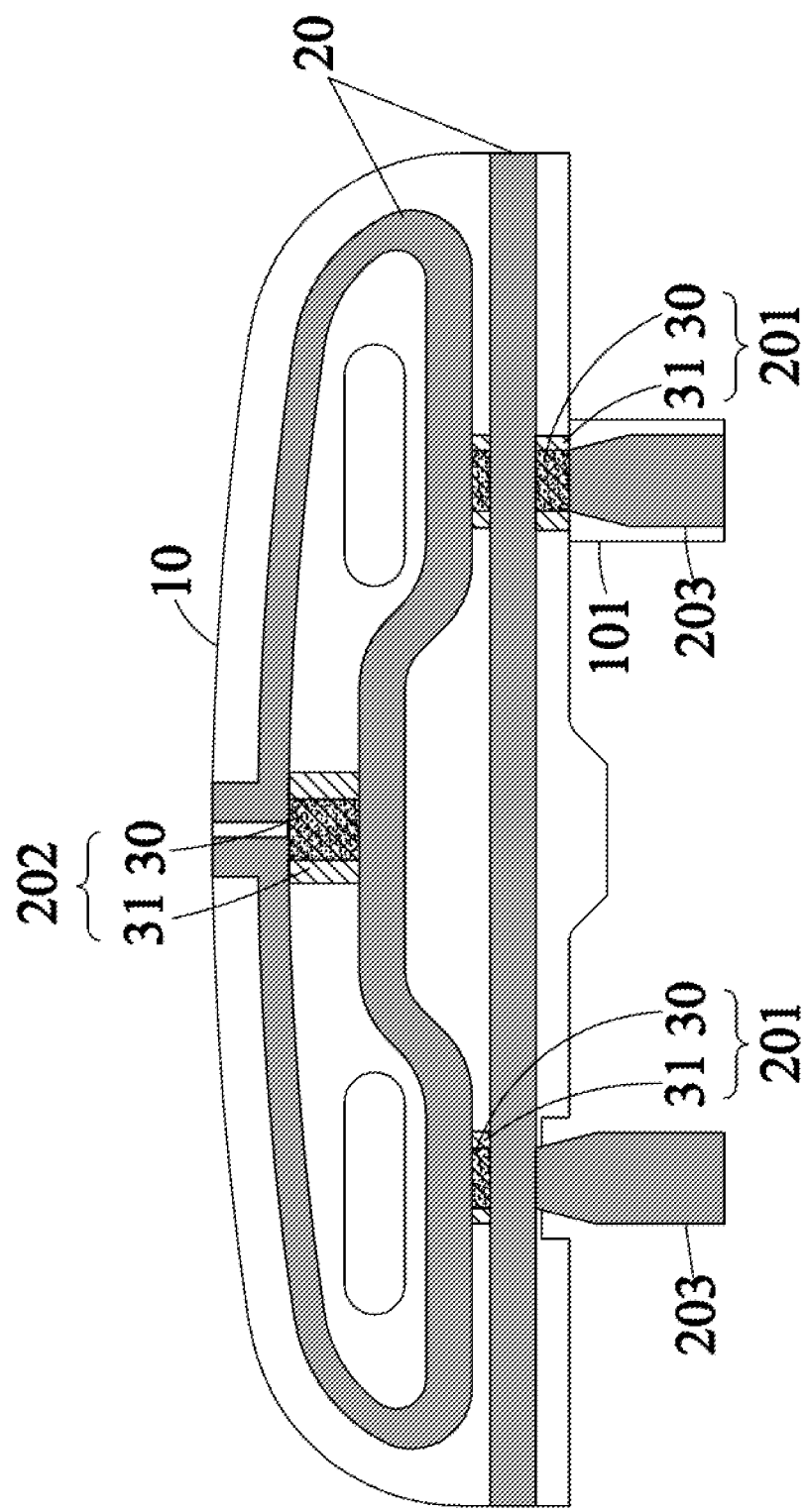
FIG. 17 is a schematic view showing a 3D circuit device according to one form of a fifth embodiment of the present invention after completion of the step S15 shown in FIG. 1.

FIGS. 15 and 16 schematically show the 3D circuit device according to a first form and a second form of a fourth embodiment of the present invention, respectively, after completion of the step S15; and FIG. 17 schematically shows the 3D circuit device according to a first form of a fifth embodiment of the present invention after completion of the step S15. As can be seen from FIGS. 15, 16 and 17, a significant difference among these three 3D circuit devices lies in the joint of the first support 203 and the base 10. Since the difference in the joint of the first support 203 and the base 10 among the above three forms of the 3D circuit device and the influence of such difference on the 3D circuit device have been explained in describing the difference among the 3D circuit devices according to the first and second forms of the second embodiment and one form of the third embodiment after completion of the step S15, it is not repeatedly described herein.

The 3D circuit devices according to the embodiments 4 and 5 are different from those according to the embodiments 2 and 3 mainly in that they are provided with two conducting junctions 201. As in the previous embodiments, each of these conducting junctions 201 is located between a first support 203 and the circuit pattern section 20 to electrically connect the first support 203 to the circuit pattern section 20. In the process of electroplating, the negative pole of a power supply is clamped to the two first supports 203 via two electrode clamps and the first supports 203 are connected to the conducting junctions 201, so that the circuit pattern section 20 electrically connected to the first supports 203 via the conducting junctions 201 can serve as a negative electrode in the electroplating process, and the pre-plating metal is deposited on the circuit pattern section 20 to form metal circuits.

By connecting a plurality of conducting junctions 201 to a plurality of first support 203 and distributing the conducting junctions 201 on the circuit pattern section 20 formed on the base 10, the circuit pattern section 20 can be connected to the negative pole of the power supply at multiple points, allowing the power input to uniformly distribute over the circuit pattern section 20. This helps in the balanced distribution of a high current that would be otherwise concentrated on the circuits closer to the one single conducting junction. In this manner, the electroplating current can be more evenly distributed over the circuit pattern section 20 to avoid the forming of a metal coating with non-uniform thickness.

Figure 18:
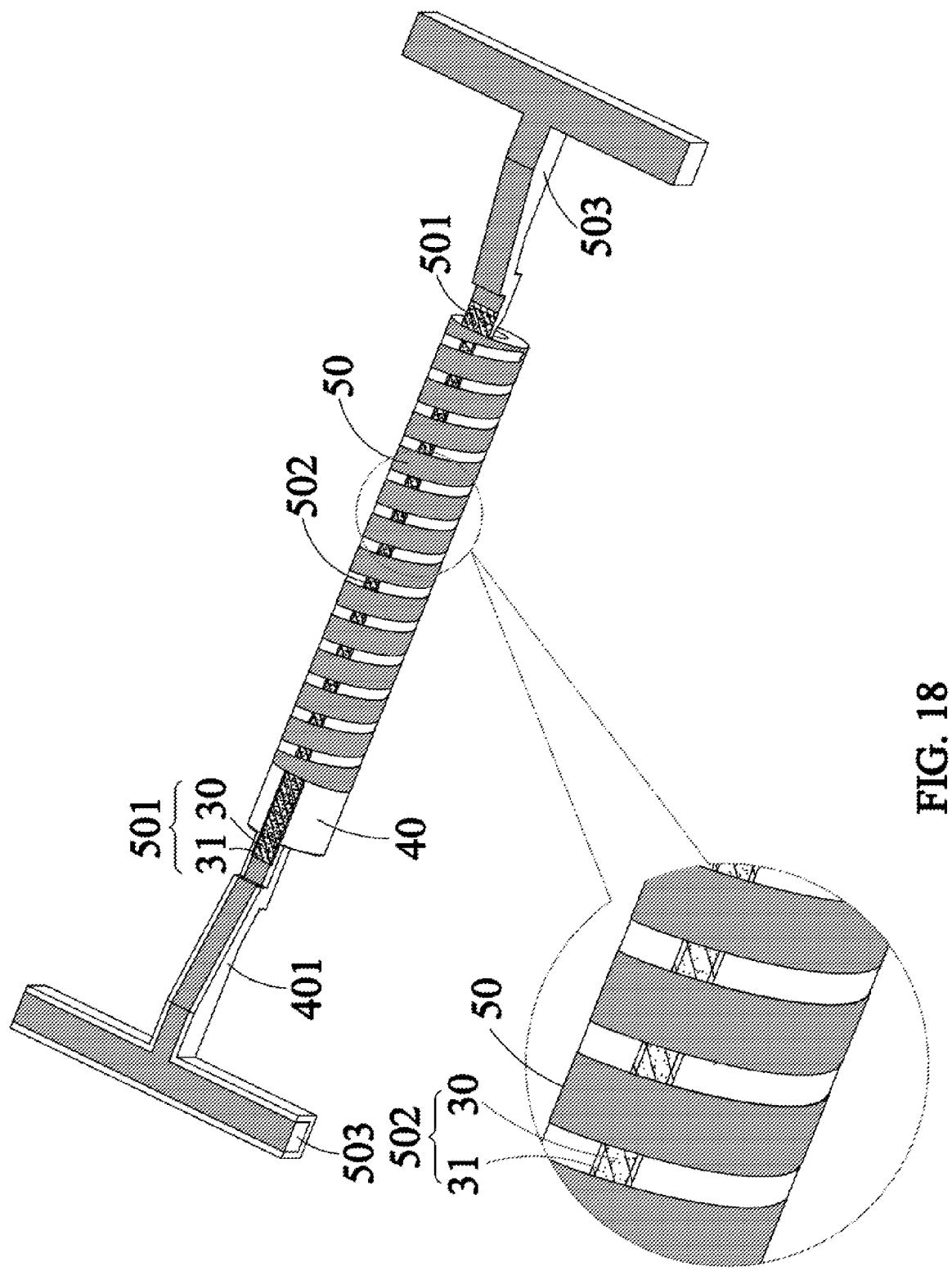
FIG. 18 is a schematic view showing a 3D circuit device according to one form of a sixth embodiment of the present invention after completion of the step S15 shown in FIG. 1.

FIG. 18 schematically shows a 3D circuit device according to one form of a sixth embodiment of the present invention after completion of the step S15. In the sixth embodiment, the 3D circuit device manufactured using the method of the present invention is in the form of a cylindrical element. As shown in FIG. 18, the cylindrical 3D circuit device after completion of the step S15 includes a non-conductive base 40, a circuit pattern section 50 formed on the base 40, a plurality of conducting junctions 501, and a plurality of current-guiding junctions 502. An interface layer 30 and an insulating layer 31 are sequentially formed to cover the conducting junctions 501 and the current-guiding junctions 502. Since the method of manufacturing the 3D circuit device according to the sixth embodiment includes steps similar to those having been described in other embodiments, it is not repeatedly described herein.

In the cylindrical 3D circuit device according to the sixth embodiment, the circuit pattern section 50 is provided around the cylindrical base 40 like a continuously extended spiral coil and has two conducting junctions 501. The two conducting junctions 501 are separately located on two first supports 503 formed at two opposite ends of the cylindrical base 40 for electrically connecting the first supports 503 to the spirally extended circuit pattern section 50, and serving as current conducting points for connecting to the negative pole of the power supply in the step of electroplating. As shown in FIG. 18, the provision of the conducting junctions 501 at two ends of the cylindrical 3D circuit device is helpful in uniformly distributing the electroplating current over the circuit pattern section 50 on the cylindrical base 40, so that the electroplating current would not concentrate at circuits closer to any of the conducting junctions 501. As a result, it is able to avoid the problem of forming thicker metal coating at some circuits closer to any of the conducting junctions 501 and thinner metal coating at other circuits farther away from any of the conducting junctions 501. In brief, the arrangement of two conducting junctions 501 as shown in FIG. 18 provides the effect of balancing the electroplating current distribution over the circuits in the circuit pattern section 50 and accordingly, the effect of forming a metal coating with uniform thickness.

Further, as shown in FIG. 18, the provision of multiple current-guiding junctions 502 along the cylindrical base 40 can effectively shorten the conducting paths among the turns of the spirally extended circuit pattern section 50, and accordingly, enables shortened conducting paths in the process of electroplating. The shortened conducting paths in turn bring the electroplating current to more uniformly distribute over the circuit pattern section 50 to avoid the problem of uneven thickness of the metal coating formed on the circuit pattern section 50.

After the electroplating is finished, the insulating layer 31 and the interface layer 30 on the conducting junctions 501 and the current-guiding junctions 502 are removed, and the substantially T-shaped first supports 503 and the second supports 401 presented at two ends of the cylindrical base 40 are removed from the base 40, so that a cylindrical 3D circuit device with the cylindrical base 40 and the spirally extended circuit pattern section 50 is obtained. Since other detailed steps have been described in the previous embodiments, they are not repeatedly described herein.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method of manufacturing 3D circuit device, comprising the steps of:
    forming a base by injection molding a first non-conductive material;
    forming at least one first support, a circuit pattern section, and at least one conducting junction on the base by injection molding a second non-conductive material, such that the at least one first support and the at least one conducting junction are electrically connectable to the circuit pattern section;
    forming an interface layer to cover the at least one first support, the circuit pattern section, and the at least one conducting junction;
    forming an insulating layer to cover a portion of the interface layer that is located on the at least one conducting junction;
    forming a metal coating to cover a portion of the interface layer that is located on the circuit pattern section;
    removing portions of the interface layer and the insulating layer that are located on the at least one conducting junction; and
    removing the at least one first support from the base to obtain a 3D circuit device.

2. The method of manufacturing 3D circuit device as claimed in claim 1, wherein the step of forming the base further includes a step of forming at least one second support by injection molding the first non-conductive material, such that the at least one second support is connected to the base.

3. The method of manufacturing 3D circuit device as claimed in claim 2, wherein the step of removing the at least one first support further includes a step of removing the at least one second support from the base.

4. The method of manufacturing 3D circuit device as claimed in claim 1, wherein the step of forming the at least one first support further includes a step of forming at least one current-guiding junction on the base by injection molding the second non-conductive material, such that the at least one current-guiding junction, the at least one first support, the circuit pattern section, and the at least one conducting junction are electrically connectable to one another on the base.

5. The method of manufacturing 3D circuit device as claimed in claim 4, wherein the step of forming the interface layer further includes a step of covering the interface layer on the at least one current-guiding junction; and wherein the step of forming the insulating layer further includes a step of covering the insulating layer on the at least one current-guiding junction; and wherein the step of removing the interface layer and the insulating layer further includes a step of removing portions of the interface layer and the insulating layer that are located on the at least one current-guiding junction.

6. The method of manufacturing 3D circuit device as claimed in claim 4, wherein the circuit pattern section includes at least one circuit, and the at least one current-guiding junction is connected to the at least one circuit.

7. The method of manufacturing 3D circuit device as claimed in claim 1, wherein the at least one first support is connected to the circuit pattern section via the at least one conducting junction.

8. The method of manufacturing 3D circuit device as claimed in claim 1, wherein the interface layer is a metal layer with electrical conductivity.

9. The method of manufacturing 3D circuit device as claimed in claim 1, wherein the interface layer is formed through chemical plating, and the metal coating is formed through electroplating.

10. The method of manufacturing 3D circuit device as claimed in claim 9, wherein the interface layer has a thickness ranged between 0.1 and 2 μm.

11. The method of manufacturing 3D circuit device as claimed in claim 1, wherein the insulating layer is selected from the group consisting of ink, paint, and insulating tape.

12. The method of manufacturing 3D circuit device as claimed in claim 1, wherein in the step of removing the interface layer and the insulating layer, the interface layer and the insulating layer are simultaneously removed by using laser; or alternatively, the insulating layer is removed first by using a liquid stripper and an ultrasonic device or using electrolysis, and the interface layer is then removed by using an acid solution or a micro-etching chemical.

* * * * *